(12) United States Patent
Seki et al.

(10) Patent No.: US 7,408,248 B2
(45) Date of Patent: Aug. 5, 2008

(54) LEAD FRAME FOR SEMICONDUCTOR DEVICE

(75) Inventors: Kazumitsu Seki, Nagano (JP); Takashi Yoshie, Nagano (JP); Koichi Kadosaki, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 167 days.

(21) Appl. No.: 10/559,247

(22) PCT Filed: Apr. 19, 2005

(86) PCT No.: PCT/JP2005/007762

§ 371 (c)(1), (2), (4) Date: Nov. 30, 2005

(87) PCT Pub. No.: WO2005/117112

PCT Pub. Date: Dec. 8, 2005

(65) Prior Publication Data

US 2006/0125073 A1 Jun. 15, 2006

(30) Foreign Application Priority Data

May 27, 2004 (JP) ............................. 2004-157668

(51) Int. Cl.
*H01L 23/495* (2006.01)

(52) U.S. Cl. .................. 257/677; 257/666; 438/123

(58) Field of Classification Search ......... 257/666–677, 257/E21.506, E21.507, E21.508, E21.509; 438/121–127

See application file for complete search history.

(56) References Cited

U.S. PATENT DOCUMENTS 5,684,329 A * 11/1997 Serizawa .................... 257/677
2002/0047186 A1* 4/2002 Tellkamp .................... 257/666

FOREIGN PATENT DOCUMENTS

| JP | 4-115558 | | 4/1992 |
| JP | 4-337657 | | 11/1992 |
| JP | 10-84065 | | 3/1998 |
| JP | 10084065 A | * | 3/1998 |
| JP | 11-111909 | | 4/1999 |
| JP | 2001-110971 | | 4/2001 |
| JP | 2002-76229 | | 3/2002 |

* cited by examiner

*Primary Examiner*—M. Wilczewski
*Assistant Examiner*—Paul E Patton
(74) *Attorney, Agent, or Firm*—Morgan & Finnegan, LLP

(57) ABSTRACT

A lead frame for semiconductor device is provided with an inner lead part and an outer lead part. A composite plating layer is provided on the entire plane of a base material constituting the lead frame or at least on the outer lead part. The composite plating layer includes a base layer composed of an Ni-based plating layer formed on the entire plane of the base material constituting the lead frame or at least on the outer lead part, a Pd or Pd alloy plating layer formed on an upper plane of the base layer with a thickness of 0.005-0.01 μm, and an Au plating layer formed on an upper plane of the Pd or Pd alloy plating layer with a thickness of 0.02-0.1 μm. The lead frame for semiconductor device has a Pd-PPF structure. In the case of mounting a semiconductor device on a board and the like with a lead-free Sn—Zn based solder or other lead-free solders by using the lead frame, wettability of the lead frame with the lead-free Sn—Zn based solder or other lead-free solders is improved and mountability of the semiconductor device can be improved.

8 Claims, 4 Drawing Sheets

- Au (0.01 μm)
- Pd (0.01 μm)
- Ni (1.0 μm)
- Cu

- Au (0.03 μm)
- Pd (0.01 μm)
- Ni (1.0 μm)
- Cu

- Au (0.05 μm)
- Pd (0.005 μm)
- Ni (1.0 μm)
- Cu

- Au (0.025 μm)
- Ag OR Ag-Au (0.025 μm)
- Pd (0.005 μm)
- Ni (1.0 μm)
- Cu

LEAD FRAME FOR SEMICONDUCTOR DEVICE

TECHNICAL FIELD

The present invention relates to a semiconductor device and, more specifically, to a lead frame for use in a semiconductor device having an improved junction or bonding property and an improved packaging property.

BACKGROUND ART

A lead frame for a semiconductor device comprises a stage for mounting a semiconductor chip, inner leads for electric connection to the electrodes of the semiconductor chip through wire bonding, and outer leads used as an external connection terminal when the semiconductor device is mounted on a substrate and the like. Here, it is desired that the stage has a good bonding property to the semiconductor chip, the inner leads have a good wire bonding property, and the outer leads have a good bonding property through soldering to a target member such as a substrate on which the semiconductor device is mounted.

FIG. 1 is a plan view illustrating one example of the lead frame for a semiconductor device. In the lead frame 10, reference numeral 12 denotes outer leads, 14 denotes inner leads, and 16 denotes a stage acting as a chip-mounting portion on which a semiconductor chip (not shown) is further mounted. The stage 16 is connected to rails 20 through support bars 18. Reference numeral 22 denotes a dambar.

As will be described later, after formation of the desired metal film on the lead frame 10, a semiconductor chip is mounted on the stage, and the semiconductor chip is connected to the inner leads through wire bonding. Finally, the semiconductor chip, wires and inner leads 14 are sealed with a resin to complete a semiconductor device. A solder film is previously formed on the outer leads 12 of the semiconductor device, or soldering is effected at the time of mounting the semiconductor device on the substrate.

Recently, in mounting the semiconductor devices on the substrates, the mounting process by using a solder free of lead (Pb) is generally carried out from the standpoint of protecting the environment. As the lead-free solder, there can be used, for example, a tin-zinc (Sn—Zn)-based solder, a tin-silver (Sn—Ag)-based solder and others.

As a lead frame for a semiconductor device, there has been known the so-called Pd-PPF (Pd-PrePlated frame) produced by plating palladium (Pd) or a Pd alloy film on a substrate consisting of Cu or a Cu alloy via a nickel (Ni)-plating layer as an underlayer and, further, forming a thin Au-plating film or a thin Ag-plating film thereon (see, JP-A-4-115558).

As another example of the lead frame for semiconductor devices having the above external plating layers, JP-A-4-337657 discloses a lead frame comprising an Ni-plating layer on the substrate of the lead frame, a Pd— or a Pd alloy-plating layer on at least the inner leads or the outer leads and, further, an Au-plating layer thereon. Further, JP-A-11-111909 discloses a plated lead frame having the similar plating layers as above, and JP-A-2001-110971 discloses a plated lead frame comprising an Ni-plated protection layer and a Pd— or a Pd alloy-plated intermediate layer formed on the substrate of the lead frame and, further, an outermost layer formed by alternately plating Pd and Au thereon. Furthermore, JP-A-2002-76229 discloses a plated lead frame produced by forming an Ni layer and a Pd layer on the substrate of the lead frame and then forming an Ag layer thereon, wherein the Ag layer can be completely melted into the Pd solder upon heating.

DISCLOSURE OF THE INVENTION

As described above, in the prior art, there have been known the so-called Au/Pd/Ni lead frames of a variety of types produced by forming an Ni-plated layer as an underlayer on the substrate of the lead frame, followed by forming a Pd— or Pd alloy-plating layer thereon and further forming an Au-plating layer thereon. When a semiconductor device is mounted on a packaging substrate by using these lead frames, there exists a problem of poor solder wettability between the lead frame and the tin-zinc (Sn—Zn)-based solder or the tin-silver (Sn—Ag)-based solder which are lead-free solders applied on the side of the substrate.

Namely, while a variety of contrivances have been made in the prior art with regard to the thicknesses of the layers of Au/Pd/Ni and other factors, there still remains a problem of insufficient solder wetting or spreading with regard to the Sn—Zn-based solder. In particular, as the solder wettability is poor on the die pad portions having wide soldering areas exposed from the packages including the resin-sealed portions, packaging troubles are sometimes resulted.

Further, in a molten state, the Sn—Zn-based solder which is a lead-free solder tends to be segregated toward the outer side of the bulk. In the Pd-PPF (Pd-PrePlated Frame) having the Au/Pd/Ni layers, Pd can diffuse in a solid phase of the molten solder. However, when the Sn—Zn-based solder is used herein, as Pd diffuses into the Zn-segregating layer at a very slow diffusing rate, there arises a state of being blocked by the Zn-segregating layer to thereby exhibit deteriorated solder wettability.

Therefore, the present invention provides a lead frame for a semiconductor device having basically a Pd-PPF (Pd-PrePlated Frame) structure, which enables the Sn—Zn-based solder, Sn—Ag-based solder or any other lead-free solder to exhibit favorable wettability when a semiconductor device using the lead frame is mounted on a packaging substrate by using the lead-free Sn—Zn-based solder, Sn—Ag-based solder or any other lead-free solder, thereby improving the packaging property of the semiconductor device.

According to the present invention, to achieve the above object, there is provided a lead frame for a semiconductor device comprising inner leads and outer leads, wherein a whole surface of the substrate constituting the lead frame or at least the outer leads has a composite plated layer. The composite plated layer formed on the lead frame comprises an underlying layer or underlayer consisting of an Ni-based plating layer formed on a whole surface of the substrate constituting the lead frame or on at least the outer leads, a Pd— or Pd alloy-plating layer of a thickness of 0.005 to 0.01 μm formed on an upper surface of the underlayer, and an Au-plating layer formed at a thickness of 0.02 to 0.1 μm on an upper surface of the Pd— or Pd alloy-plating layer.

Further, according to the present invention, there is provided another lead frame for a semiconductor device comprising inner leads and outer leads, wherein a whole surface of the substrate constituting the lead frame or at least the outer leads has a composite plated layer. The composite plated layer formed on the lead frame comprises an underlayer consisting of an Ni-based plating layer formed on the whole surface of the substrate constituting the lead frame or on at least the outer leads, a Pd— or Pd alloy-plating layer of a thickness of 0.005 to 0.01 μm formed on an upper surface of the underlayer, and an Ag— or Ag—Au alloy-plating layer of a thickness of not larger than 0.03 μm and an Au-plating layer of a thickness of not larger than 0.03 μm formed successively on an upper surface of the Pd— or Pd alloy-plating layer.

Preferably, the Ag— or Ag—Au alloy-plating layer and the Au-plating layer each is used as a single layer.

Furthermore, according to the present invention, there is provided a still another lead frame for a semiconductor device comprising inner leads and outer leads, wherein a whole surface of the substrate constituting the lead frame or at least the outer leads has a composite plated layer. The composite plated layer formed on the lead frame comprises an underlayer consisting of an Ni-based plating layer formed on the whole surface of the substrate constituting the lead frame or on at least the outer leads, a Pd— or Pd alloy plating layer of a thickness of 0.005 to 0.01 ~m formed on an upper surface of the underlayer, and Ag— plating layers and Au-plating layers each having a thickness of 0.02 to 0.2 ~, alternately formed on an upper surface of the Pd— or Pd alloy-plating layer. Preferably, the Ag plating layers and the Au-plating layers each is used as two layers, that is, as a total of four layers According to the present invention, when the thickness of the Pd— or Pd alloy-plating layer and the thickness of the Au-plating layer or the Ag-plating layer formed thereon is controlled to be within the predetermined ranges, it becomes possible to improve the solder wettability relative to the lead-free Sn—Zn-based solder, lead-free Sn—Ag-based solder or any other lead-free solder and thus to improve the bonding and packaging property of the semiconductor device onto the packaging substrate.

BEST MODE FOR CARRYING OUT THE INVENTION

Hereinafter, the embodiments and examples of the invention will be described in detail with reference to the accompanying drawings in comparison with the prior art examples.

Figure 4:
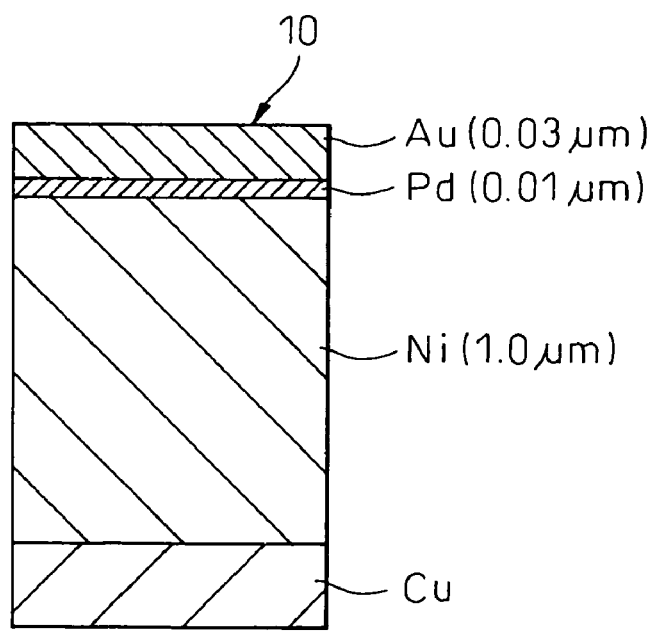
FIG. 4 is a sectional view illustrating a plated structure of a lead frame according to Example 1 of the present invention.

FIG. 4 is a sectional view illustrating a lead frame according to Example 1 of the present invention. As shown, the lead frame has layers plated on the surface of the substrate of the lead frame to obtain an Au/Pd/Ni lead frame structure. The lead frame 10 for the semiconductor device is produced by forming an Ni-plating layer as an underlayer on the surface of the substrate consisting of Cu, followed by forming a Pd-plating layer on the Ni-plating layer and then forming an Au-plating layer thereon. In this example, the plating conditions such as the plating time and the like are controlled to obtain the Ni-plating layer having a thickness of 1.0 µm, the Pd-plating layer having a thickness of 0.01 µm and the Au-plating layer having a thickness of 0.03 µm. However, it should be noted in this example and other examples described below, the substrate may be made of a Cu alloy or any other material instead of Cu.

Figure 5:
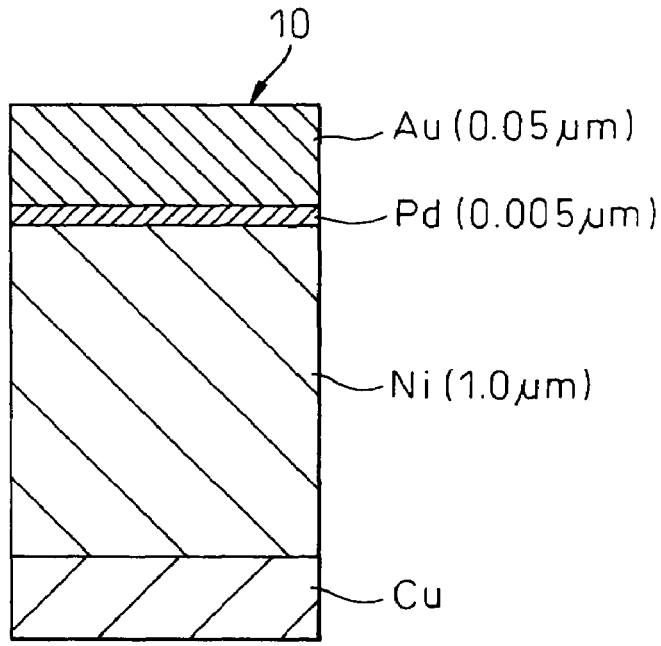
FIG. 5 is a sectional view illustrating a plated structure of a lead frame according to Example 2 of the present invention.

FIG. 5 is a sectional view illustrating a lead frame according to Example 2 of the present invention. As shown, the lead frame has layers plated on the surface of the substrate of the lead frame to obtain an Au/Pd/Ni lead frame structure. As in Example 1, the lead frame 10 has an Ni-plating layer as an underlayer formed on the surface of the substrate consisting of Cu, a Pd-plating layer formed on the Ni-plating layer and, an Au-plating layer formed on the Ni-plating layer. However, in this example, the plating conditions such as the plating time and the like were changed to obtain the Pd-plating layer having a thickness of 0.005 µm and the Au-plating layer having a thickness of 0.05 µm, while a thickness of the Ni-plating layer was 1.0 µm as in Example 1.

Figure 1:
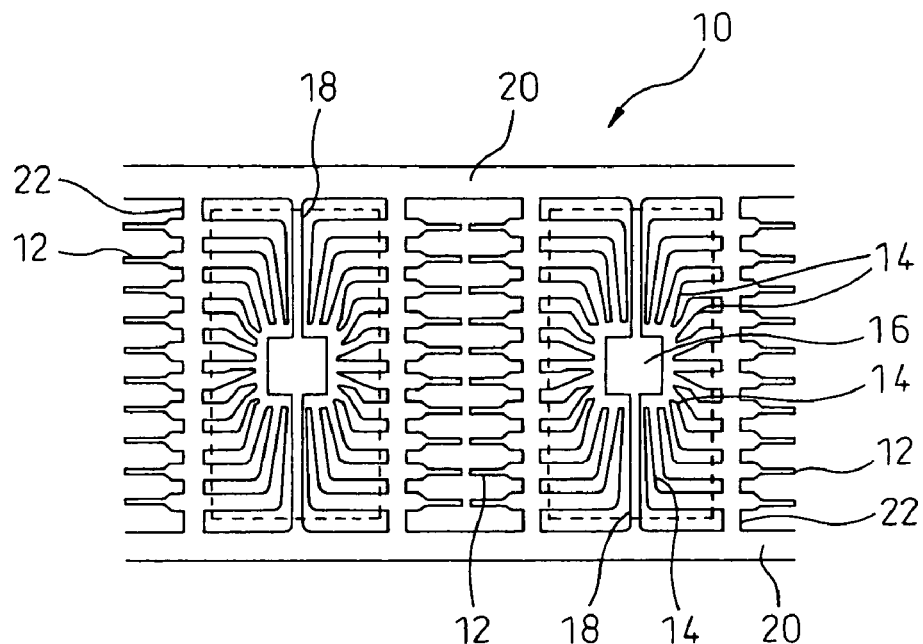
FIG. 1 is a plan view illustrating a conventional lead frame for a semiconductor device.
Figure 2:
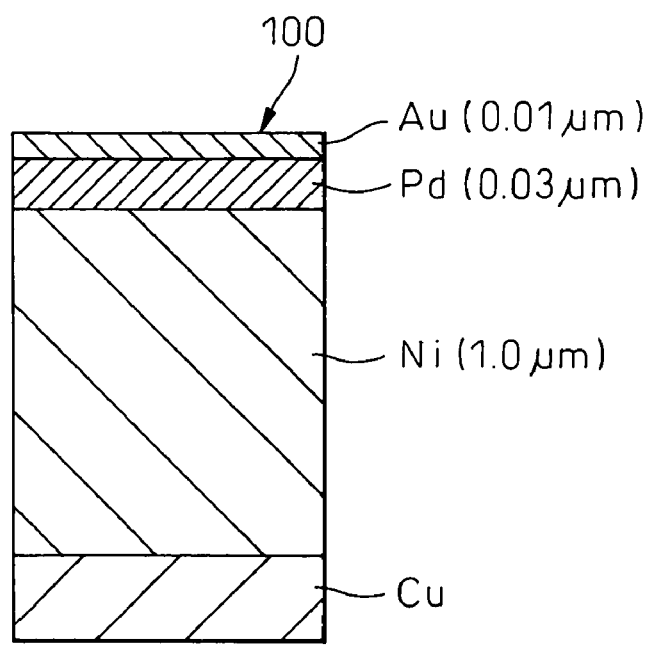
FIG. 2 is a sectional view illustrating a plated structure of a conventional lead frame.
Figure 3:
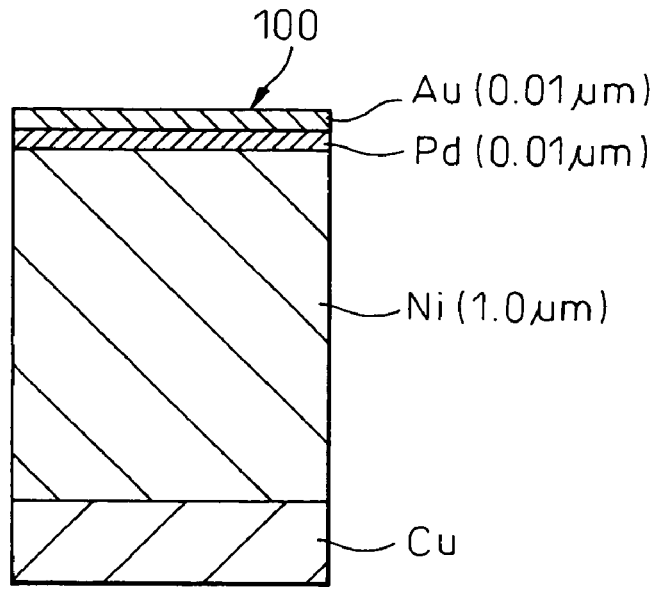
FIG. 3 is a sectional view illustrating a plated structure of another conventional lead frame.

FIGS. 2 and 3 are sectional views of prior art lead frames of the Au/Pd/Ni structure produced by forming plated layers on a surface of the substrate of the lead frames. In the prior art examples shown in FIGS. 2 and 3, an Ni-plating layer as an underlayer is formed on the surface of the substrate consisting of Cu, the Pd-plating layer is formed on the Ni-plating layer, and the Au-plating layer is further formed on the Pd-plating layer as in Examples 1 and 2 illustrated in FIGS. 4 and 5, respectively. Similarly, the thickness of the Ni-plating layer is adjusted to be 1.0 µm. In the prior art illustrated in FIG. 2, however, the plating conditions such as the plating time and the like are so adjusted that the resulting Pd-plating layer has a thickness of 0.03 µm and the Au-plating layer has a thickness of 0.01 µm. Further, in the prior art illustrated in FIG. 3, the plating conditions such as the plating time and the like are so adjusted that the Pd-plating layer has a thickness of 0.01 µm and the Au-plating layer has a thickness of 0.01 µm.

To compare Examples 1 and 2 with the prior art examples, several kinds of evaluation samples are prepared by using the Au/Pd/Ni lead frames having different thicknesses of the plated layers to evaluate their solder wettability.

First, there were prepared the following six kinds of evaluation samples consisting of the Au/Pd/Ni lead frames in which the Ni-plating layer has a constant thickness of 1.0 µm and the Pd-plating layer has a constant thickness of 0.01 µm, while varying the thickness of the Au-plating layer as in Example 1 of FIG. 4 and the prior art example of FIG. 3. The samples are evaluated for their solder wettability according to the following procedure.

1) Au: 0.005 µm/Pd: 0.010 µm/Ni: 1.0 µm/Cu substrate
2) Au: 0.010 µm/Pd: 0.010 µm/Ni: 1.0 µm/Cu substrate (prior art example of FIG. 3)
3) Au: 0.020 µm/Pd: 0.010 µm/Ni: 1.0 µm/Cu substrate
4) Au: 0.050 µm/Pd: 0.010 µm/Ni: 1.0 µm/Cu substrate
5) Au: 0.100 µm/Pd: 0.010 µm/Ni: 1.0 µm/Cu substrate
6) Au: 0.200 µm/Pd: 0.010 µm/Ni: 1.0 µm/Cu substrate First, a lead-free Sn—Zn-based solder paste is coated onto the sample lead frames to form a cylindrical coating having a diameter of 1.6 mm and a height of 0.2 mm. The solder paste has a composition of Sn-8Zn-3Bi.

Next, the samples having the coated solder paste are heated on a hot plate at 220° C. for 60 seconds. Next, the diameters of the solders wet and spread over the samples upon the heating are measured at five measuring points. Thereafter, an average value of the diameters of the solders measured at five points is determined to compare it with the diameter (1.6 mm) of the solder paste measured before heating. Average values (%) of diameters of the solder paste after heating, i.e., wetting and spreading of the solder indicated based on the diameter of the solder paste before heating as 100%, are plotted in FIG. 8.

Figure 8:
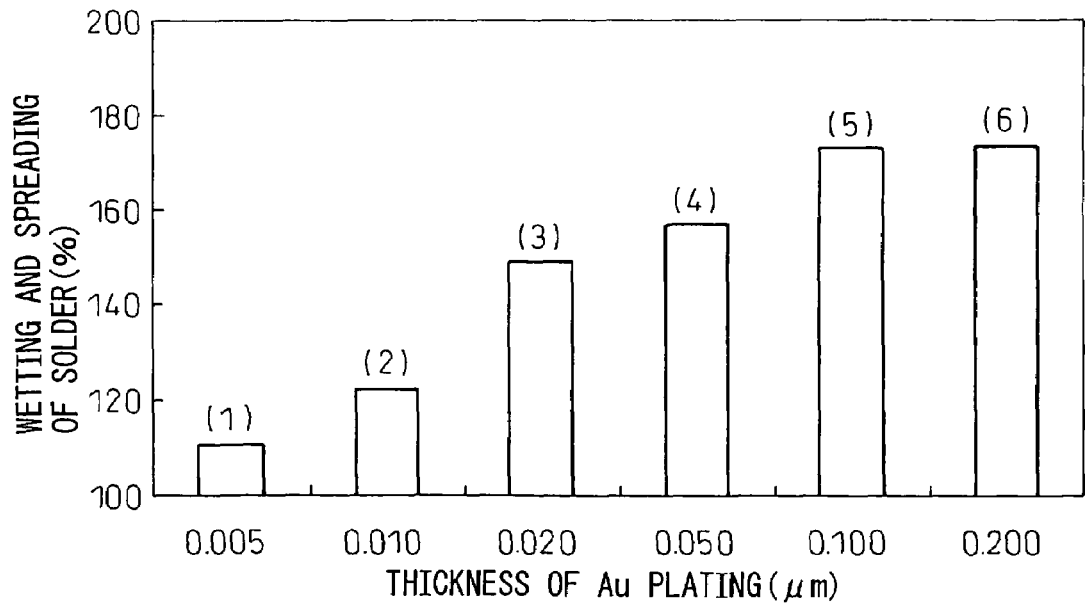
FIG. 8 is a graph showing a relationship between the thickness of the Au plating and the wetting and spreading of the solder.

As will be understood from FIG. 8, when the thickness of the Au-plating layer is not larger than 0.010 μm as in the samples (1) and (2), the wetting and spreading of the solder is about 120% or less, and thus it can be appreciated that a good solder wettability cannot be obtained. On the other hand, when the thickness of the Au-plating layer is not smaller than 0.020 μm as in the samples (3) to (6), it is appreciated that a good solder wettability can be obtained. Note that, in the samples (1) to (6) that the sample (2) corresponds to the prior art of FIG. 3, and Example 1 of FIG. 4 should be positioned between the sample (3) and the sample (4).

Next, with regard to the same Au/Pd/Ni lead frames, there are prepared 14 kinds of lead frame samples shown in Table 1 below, by varying not only the thickness of the Au-plating layer but also the thickness of the Pd-plating layer. The samples were evaluated for their Sn/Zn solder wettability in accordance with the manner similar to the evaluation method described above. The results are summarized in Table 1 below.

TABLE 1

| | Structure of Plating: Au/Pd/Ni/Cu substrate | | | Wettability of Sn/Zn solder | |
|---|---|---|---|---|---|
| Sample No. | Au plating thickness [μm] | Pd plating thickness [μm] | Ni plating thickness [μm] | No preheating | After heating at 350° C. × 30 sec. |
| 1 | — | 0.03 | 1.0 | not passed | bad |
| 2 | 0.1 | — | 1.0 | good | bad |
| 3 | 0.005 | 0.03 | 1.0 | not passed | not passed |
| 4 (FIG. 7) | 0.01 | | 1.0 | not passed | not passed |
| 5 | 0.02 | | 1.0 | not passed | not passed |
| 6 | 0.005 | 0.01 | 1.0 | not passed | not passed |
| 7 (FIG. 8) | 0.01 | | 1.0 | passed | passed |
| 8 | 0.02 | | 1.0 | good | good |
| 9 | 0.05 | | 1.0 | good | good |
| 10 | 0.1 | | 1.0 | good | good |
| 11 | 0.2 | | 1.0 | good | good |
| 12 | 0.005 | 0.005 | 1.0 | not passed | not passed |
| 13 | 0.01 | | 1.0 | passed | passed |
| 14 | 0.02 | | 1.0 | good | good |

As shown in Table 1, the solder wetting area of the lead frame samples (Sample Nos. 1 to 14) is measured under the conditions of no preheating as the pretreatment and after heating at 350° C. for 30 seconds. In Table 1, "bad" represents the solder wetting areas of not larger than 100%, i.e., represents a case where the solder is repelled, "not passed" represents the solder wetting areas of 100 to 120%, i.e., represents a case where the solder cannot be used, "passed" represents the solder wetting areas of 121 to 150%, i.e., represents a case where the solder can be used, and "good" represents the solder wetting areas of not smaller than 151% which is favorable.

It can be appreciated, from the results of Table 1, that good solder wettability can be obtained when the thickness of the Pd-plating is 0.01 μm, if the thickness of the Au-plating is not smaller than 0.02 μm. Accordingly, in Example 1 shown in FIG. 4, as the thickness of the Au-plating is 0.03 μm, good solder wettability can be obtained as shown in Table 1.

Further, it can be appreciated that good solder wettability can be obtained even when the thickness of the Pd-plating is 0.005 μm, if thickness of the Au-plating is not smaller than 0.02 μm. Accordingly, in Example 2 shown in FIG. 5, as the thickness of the Au-plating is 0.05 μm, good solder wettability can be obtained as shown in Table 1.

That is, in the lead frame of the Au/Pd/Ni structure, a good solder wettability can be obtained if the thickness of the Pd-plating layer is reduced to a degree that does not lose the heat resistance, and an Au-plating layer capable of quickly diffusing into the Zn-segregating layer of lead-free solder is formed at the required thickness.

Figure 6:
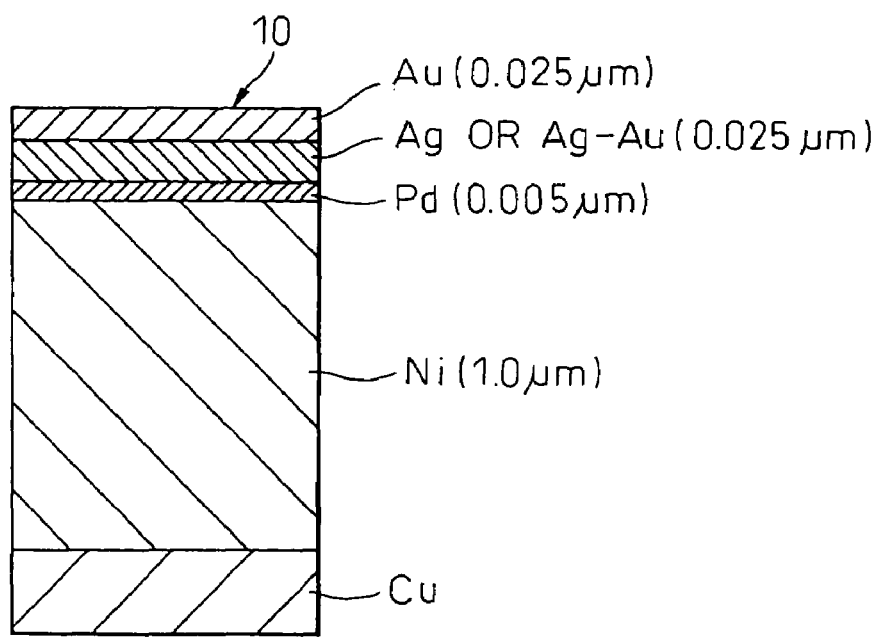
FIG. 6 is a sectional view illustrating a plated structure of a lead frame according to Example 3 of the present invention.
Figure 7:
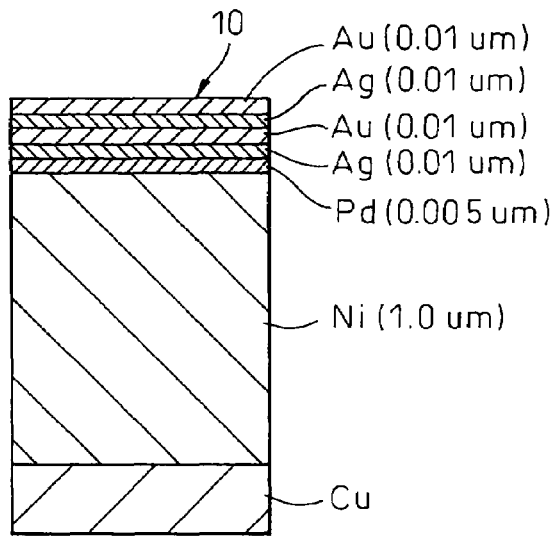
FIG. 7 is a sectional view illustrating a plated structure of a lead frame according to Example 4 of the present invention.

FIGS. 6 and 7 illustrate lead frames for semiconductor devices according to Examples 3 and 4 of the present invention, respectively. FIG. 6 corresponding to Example 3 illustrates a constitution in which a Pd-plating layer is formed on an Ni-plating layer on the surface of the substrate (Cu) of the lead frame, and an Ag-plating layer or an Ag—Au alloy-plating layer and an Au-plating layer are further successively formed on the Pd-plating layer, and FIG. 7 corresponding to Example 4 illustrates a constitution in which a Pd-plating layer is formed on an Ni-plating layer on the surface of the substrate (Cu) of the lead frame, and Ag-plating layers and Au-plating layers are further alternately formed on the Pd-plating layer. Note that, in these layer constitutions, an Ag-plating layers and/or Au-plating layer may be further deposited, if desired.

The examples of the present invention were described above with reference to the accompanying drawings. It should be noted that the present invention should not be limited to the above examples, and it can be modified or improved in a variety of forms within the spirit and scope of the present invention.

UTILITY OF EXPLOITATION IN INDUSTRY

As described above, the present invention provides a lead frame for a semiconductor device having an Au/Pd/Ni structure, wherein the thicknesses of the plated layers of Au/Pd/Ni, particularly the thickness of the Pd-plating layer or the Au-plating layer is suitably selected so that when a semiconductor device using the lead frame is mounted on a packaging substrate by using a lead-free Sn—Zn-based solder or a lead-free Sn—Ag-based solder, the wettability can be improved for the lead-free solder and thus the packaging property of the semiconductor device on the packaging substrate can be improved.

In addition, according to the present invention, when a lead frame for a semiconductor device is produced by forming a Pd-plating layer on an Ni-based plating layer on the surface of the substrate of the lead frame, followed by successively forming an Ag-plating layer or an Ag—Au alloy-plating layer and an Au-plating layer thereon or alternately forming Ag-plating layers and Au-plating layers thereon if, particularly, the thickness of the Pd-plating layer, Au-plating layer or Ag-plating layer is suitably selected, it becomes possible to improve the wettability to the lead-free Sn—Zn-based solder or the lead-free Sn—Ag-based solder, as in the above lead frame.

The invention claimed is:

1. A lead frame for use in a semiconductor device comprising inner leads and outer leads, wherein a whole surface of the substrate constituting the lead frame or at least the outer leads has a composite plated layer applied thereon, and the composite plated layer comprises an underlayer consisting of an Ni-based plating layer deposited on the whole surface of the substrate constituting the lead frame or on at least the outer leads, a Pd— or Pd alloy-plating layer deposited at a thickness of 0.005 to 0.01 μm on an upper surface of the underlayer, and an Ag— or Ag—Au alloy-plating layer of a thickness of not larger than 0.03 μm and an Au-plating layer of a thickness of not larger than 0.03 μm successively deposited on an upper surface of the Pd— or Pd alloy-plating layer.

2. A lead frame according to claim 1, wherein the Ag— or Ag—Au alloy-plating layer and the Au-plating layer each has a single layer structure.

3. A lead frame for use in a semiconductor device comprising inner leads and outer leads, wherein a whole surface of the substrate constituting the lead frame or at least the outer leads has a composite plated layer applied thereon, and the composite plated layer comprises an underlayer consisting of an Ni-based plating layer deposited on the whole surface of the substrate constituting the lead frame or on at least the outer leads, a Pd— or Pd alloy-plating layer deposited at a thickness of 0.005 to 0.01 μm on an upper surface of the underlayer, and Ag-plating layers and Au-plating layers each having a thickness of 0.02 to 0.2 μm, alternately deposited on an upper surface of the Pd— or Pd alloyplating layer.

4. A lead frame according to claim 3, wherein the Ag-plating layers and the Au-plating layers are each formed as two layers.

5. A lead frame according to claim 1, wherein the substrate comprises Cu or a Cu alloy.

6. A lead frame according to claim 2, wherein the substrate comprises Cu or a Cu alloy.

7. A lead frame according to claim 3, wherein the substrate comprises Cu or a Cu alloy.

8. A lead frame according to claim 4, wherein the substrate comprises Cu or a Cu alloy.

* * * * *

UNITED STATES PATENT AND TRADEMARK OFFICE
CERTIFICATE OF CORRECTION

PATENT NO. : 7,408,248 B2  
APPLICATION NO. : 10/559247  
DATED : August 5, 2008  
INVENTOR(S) : Seki et al.

Page 1 of 1

It is certified that error appears in the above-identified patent and that said Letters Patent is hereby corrected as shown below:

In column 3, line 12, please delete "~m", and insert therefore -- µm --,

In column 3, line 14, please delete "~", and insert therefore -- µm --,

In column 3, line 16, please delete "Agplating", and insert therefore -- Ag plating --, In column 3, line 17, please delete "layers", and insert therefore -- layers. --, and In column 3, after line 17, please add the following three paragraphs:

-- In addition, according to the present invention, the lead frame for a semiconductor device preferably has a lead-free solder layer further formed on the composite plated layer. The lead frame of the invention can be mounted, via the lead-free solder layer, on a packaging substrate for mounting a semiconductor device.

According to another preferred embodiment of the present invention, the above-described lead frame for a semiconductor device may be so designed as to be mounted, via a lead-free solder layer, on a packaging substrate for mounting a semiconductor device after the lead-free solder layer has been formed on the composite plated layer of the lead frame.

In such a preferred embodiment, the lead-free solder layer formed on the composite plated layer of the lead frame, though not restricted to, is preferably formed from a lead-free Sn—Zn-based solder, a lead-free Sn—Ag-based solder or a combination thereof. --

Signed and Sealed this

Eleventh Day of August, 2009

David J. Kappos  
*Director of the United States Patent and Trademark Office*